Dec. 13, 1955 H. A. MUSK 2,727,145
CRYSTAL CONTROLLED OSCILLATOR
Filed Feb. 14, 1950
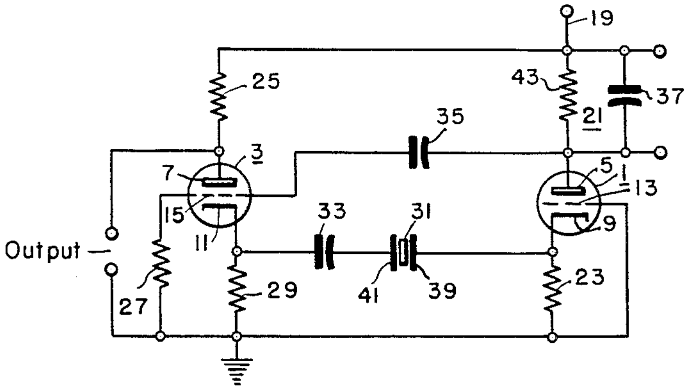
WITNESSES:
E. A. McCloskey
Wm. C. Groome
INVENTOR
Henry A. Musk.
BY
Hyman Diamond
ATTORNEY United States Patent Office 2,727,145

Patented Dec. 13, 1955

2,727,145

CRYSTAL CONTROLLED OSCILLATOR

Henry A. Musk, Glen Burnie, Md., assignor to Westinghouse Electric Corporation, East Pittsburgh, Pa., a corporation of Pennsylvania Application February 14, 1950, Serial No. 144,099

4 Claims. (Cl. 250—36)

My invention relates to electric discharge apparatus and it has particular relation to oscillation generators of the type including a frequency determining component having a plurality of modes of oscillation.

My invention arises from my work on the crystal oscillator included in a multi-frequency communication set. This oscillator includes a silver plated, TD cut, quartz crystal which is center mounted. The crystal is cut to operate in the range between 50 kc. and 250 kc. In the multi-frequency communication equipment the crystal oscillator includes provision for tuning the crystal to zero beat with a primary frequency standard.

The crystals included in the crystal oscillator have a plurality of modes of oscillation. Customarily it oscillates in a fundamental or principal mode and in a plurality of harmonic modes of higher frequency than the fundamental mode. Oscillators in accordance with the teachings of the prior art of which I am aware include a parallel network consisting of an inductor and a capacitor tuned to the principal mode frequency and connected in the anode or grid circuit of the oscillator tube. This network causes the crystal to oscillate in its principal mode. In working with oscillators including the inductor-capacitor network, I have found that such an oscillator is on occasions not stable in frequency.

It is accordingly a specific object of my invention to provide a crystal oscillator which shall have high frequency stability.

Another specific object of my invention is to provide a crystal oscillator which shall be effectively maintained in oscillation at a frequency equal to the fundamental frequency of the crystal.

A general object of my invention is to provide an oscillator including a frequency determining component such as a crystal, a magnetostrictive bar or a cavity, having a plurality of modes of oscillation, which shall be effectively and reliably maintained in oscillation at a preselected frequency corresponding to one of the mode frequencies of the component.

My invention arises from my realization that in prior art oscillators the inductor-capacitor network is not fully effective in maintaining the oscillator in operation at the principal mode frequency of the crystal because of its resonance characteristic. In the system in which it performs the frequency selection, the inductor-capacitor network is tuned to resonance. At resonance the network has in effect resistive impedance and introduces no phase shift in the feedback loop of the oscillator. In the region of resonance however, the frequency response of this network is sharply sensitive to changes in the inductance or the capacity. The changes may arise not only from variations in the lumped capacity or inductance of the components of the network by reason of temperature changes or aging, for example, but also from variations in the interelectrode capacities of the tubes in the oscillator circuit. As the network becomes detuned from resonance it develops in effect capacitive or inductive impedance and introduces substantial phase shift. At the half-power points of the resonance curve the phase shift is as high as 45°. Since the total phase shift around the loop must be 360°, the shift produced by the detuned resonant network must be compensated by a frequency shift in the crystal. In a high phase network this requirement introduces unstability.

In accordance with my invention the above discussed defect of the prior art oscillator is overcome by providing an oscillator including a resistor-capacitor network tuned to function as a low pass filter with respect to the selected frequency mode of the crystal. This resistor-capacitor filter, if properly tuned to the frequency of the selected mode of oscillation of the crystal, suppresses oscillation at the higher frequency modes of the crystal. In particular, a resistor-capacitor network selected to function as a filter for the fundamental frequency of the crystal effectively prevents oscillation of the crystal at higher frequency modes since the frequencies of the higher modes are of the order of 10 times or more of the frequency of the lowest mode. The resistor-capacitor network introduces a small phase shift in the feedback loop but this shift is unaffected by changes in the capacity or the resistance of the network. The oscillator is therefore stable.

The novel features that I consider characteristic of my invention are set forth with particularity in the appended claims. My invention itself however, both as to its organization and its method of operation, together with additional objects and advantages thereof will best be understood from the following description of a specific embodiment when read in connection with the accompanying drawing, in which the single figure is a circuit diagram showing a preferred embodiment of my invention.

The apparatus shown in the drawing comprises a pair of electric discharge paths 1 and 3 preferably of the high vacuum type. Each path is defined by an anode 5 and 7, respectively, and a cathode 9 and 11, respectively, and includes a control grid 13 and 15, respectively. These paths may be included in a single evacuated envelope or in separate envelopes as shown. Each may have several grids in addition to the control grid.

The apparatus is adapted to be supplied from a direct current power supply (not shown) which may be in turn derived by rectification from an alternating supply (not shown). The apparatus may be provided with a terminal 19 with the usual facilities (not shown) for connection to the hot terminal of the power supply, the other terminal may be at ground. Between the hot terminal 19 and the anode 5 of one path 1 a resistor-capacitor parallel network 21 is connected. The control electrode 13 of this path is grounded and the cathode 9 is connected to ground through a resistor 23 of moderate magnitude.

The anode 7 of the other path 3 is connected to the hot terminal 19 through a load resistor 25 of moderate magnitude. The control electrode 15 of this path is grounded through a grid resistor 27. The cathode 11 is connected to ground through a resistor 29 of moderate magnitude.

Between the cathodes 9 and 11 of the two paths a crystal oscillator 31 is connected in series with a tuning capacitor 33. A coupling capacitor 35 is connected between the anode 5 of the first path and the control electrode 15 of the latter path. Output is derived from the oscillator between the anode 7 of the latter path and ground.

The discharge paths 1 and 3 are so connected in the circuit that one is conductive and the other non-conductive at any time. The relationship between the paths is dynamic. The impedance of the two circuits are so interconnected and interrelated that as the conductivity of one of the paths increases the conductivity of the other path decreases, by virtue of the increase in the conductivity of the first path and conversely as the conductivity of the second path decreases it causes the conductivity of the first path to increase. The conductivities of the two paths continue to vary in one sense until one of the paths reaches its maximum conductivity. At this point the operation is reversed.

Assume that the conductivity of the first path 1 has reached maximum magnitude. At this time the capacitor 37 in the resistor-capacitor network 21 is charged with its plate which is coupled to the control electrode 15 of the second path 3 negative and a substantial negative control potential is impressed on the second path. At this time also the crystal electrode 39 connected to the cathode 9 of the first path 1 is charged positive and the electrode 41 connected to the trimming capacitor 33 negative. The current flow through the resistor 29 in series with the cathode 11 of the second path 3 is substantially zero.

While the first path is in this maximum conductive condition the crystal 31 is vibrating mechanically and in its vibration reaches a point at which the capacitor formed by the crystal and its electrodes 39 and 41 begins to discharge. A small positive current now flows from the crystal electrode 39 connected to the cathode of the first path 1 through the associated resistor 23. A small positive current also flows through the resistor 29 to the other electrode 41. The positive potential of the cathode 9 is thus slightly increased, and the current flow through the first path 1 is slightly decreased. In addition, the potential of the other cathode 11 is slightly decreased. Because the current flow through the first path 1 decreases, the capacitor 37 in the resistor-capacitor network 21 discharges through the resistor 43, and the potential of the control electrode 15 of the second path 3 is algebraically increased. The current flow through the second path 3 is accordingly increased. The increase in this current flow is probably enhanced by the decrease in the potential of the cathode 11. Because of the increase in the conductivity of the second path, additional positive charge flows to the crystal electrode 41 connected to the capacitor 33 and increased positive charge flows away from the other crystal electrode 39 through the cathode resistor 23 of the first path 1 to ground. The conductivity of the first path is now further decreased increasing algebraically the potential of the control electrode 15 of the second path 3 and further increasing the conductivity of this path. This cumulative operation is continued until the second path 3 becomes fully conductive and the first path 1 fully non-conductive and at this point, by reason of the vibration of the crystal, the operation is reversed.

The capacitor 37 and the resistor 43 of the capacitor-resistor network 21 must be so selected that the discharge of the capacitor 37 through the resistor 43 is properly coordinated with the mechanical movement of the crystal 31. If the resistance 43 is too high, the conductivity of the second path 3 fails to respond to the variation in the conductivity of the first path. If this resistance is too low, the potentials which are impressed in the control circuit of the second path 3 are insufficient to control it effectively.

A capacitor 37 and a resistor 43 selected to produce proper variations in the potentials impressed in the control circuit of the second path 3 for a frequency corresponding to the principal mode of the crystal is not responsive to higher modes. The frequencies corresponding to a mode other than the principal mode is at least 10 times the principal frequency. At this frequency, the capacitor of the resistor-capacitor network would have approximately $\frac{1}{10}$ the impedance which it has for the principal frequency. At this impedance, the potentials impressed in the control circuit of the second path 3 would be entirely too low to cause this path to operate properly in the feedback loop of the system. The generator would simply fail to oscillate.

An inductive-capacitive network in place of the resistive-capacitive network would introduce a phase shift in the feedback loop through the capacitor 35 depending on the extent to which it is detuned. The resistor-capacitor network 21 introduces a small initial phase shift which does not vary substantially as the capacitor 37 or resistor 43 changes. Therefore, the network maintains the crystal in oscillations at the selected frequency mode.

A system which I have constructed and found to be fully and completely operative has the following components.

| | |
|---|---|
| First discharge path 1 | 6J5 |
| Second discharge path 3 | 6J5 |
| Load resistor 25 ohms | 1,000 |
| Grid resistor 27 do | 1,000,000 |
| Cathode resistor 23 of second 3-path do | 1,000 |
| Trimming capacitor 33 micromicrofarads | 100 to 300 |
| Crystal 31, DT-cut, center mounted frequency kc | 100 |
| Coupling capacitor 35 micromicrofarads | 100 |
| Resistor 43 of network ohms | 22,000 |
| Capacitor 37 of network micromicrofarads | 43 |
| First path cathode resistor 23 ohms | 1,000 |

The circuit which I have shown herein is one of a number of circuits which can be used in the practice of my invention. Analogous circuits to which my invention may be applied are shown in Stevenson Patent 2,165,517 and Horton 1,606,791.

In its specific aspects my invention is applicable to a system such as is shown including a crystal electromechanical frequency determining component. It may also be applied in systems including magnetostrictive oscillators or a purely electrical frequency determining component such as a cavity resonator. Such application of my invention resides within the broad scope thereof.

I have shown and described a certain specific embodiment of my invention. However, I am fully aware that many modifications thereof are possible. My invention, therefore, is not to be restricted except insofar as is necessitated by the prior art and by the spirit of the appended claims.

I claim as my invention:

1. In combination, conductors for connecting to opposite terminals of a power supply; a first electric discharge path defined by an anode and a cathode and including a control electrode; a second discharge path defined by an anode and a cathode and including a control electrode; a frequency determining component having a plurality of modes of vibration; a resistance-capacitor network tuned to the frequency of one of said modes; connections connecting in series one of said conductors, said network, said anode and cathode of said first path, a first resistor and another of said conductors; connections connecting in series said one conductor, a load resistor, said anode and cathode of said second path, a second resistor and said other conductor; connections connecting said component between said cathodes; connections connecting said control electrodes to said other conductor and coupling between said network and said control electrode of said second path.

2. In combination, conductors for connecting to opposite terminals of a power supply; a first electric discharge path defined by an anode and a cathode and including a control electrode; a second discharge path defined by an anode and a cathode and including a control electrode; a frequency determining component having a plurality of modes of vibration; a resistance-capacitor network tuned to the frequency of the lowest frequency mode of said modes; connections connecting in series one of said conductors, said network, said anode and cathode of said first path, a first resistor and another of said conductors; connections connecting in series said one conductor, a load resistor, said anode and cathode of said second path, a second resistor and said other conductor; connections connecting said component between said cathodes; connections connecting said control electrodes to said other conductor and coupling between said network and said control electrode of said second path.

3. An electronic oscillation generator comprising a pair of electron discharge devices, each having an anode, a cathode, and a control electrode, means for impressing anode operating potentials on each of said devices, means coupling the anode of one of said devices to the control electrode of the other, a frequency determining element having a plurality of modes of vibration, means coupling the cathode of said one device through said element to the cathode of the other, and a mode filter consisting of a resistance-capacitance network connected in the anode circuit of said one device.

4. An electronic oscillation generator comprising a pair of electron discharge devices, each having an anode, a cathode, and a control electrode, means for impressing anode operating potentials on each of said devices, means coupling the anode of one of said devices to the control electrode of the other, a piezoelectric crystal, means coupling the cathode of said one device through said crystal to the cathode of the other, and a mode filter consisting of a resistance-capacitor network connected in the anode circuit of said one device and tuned to the lowest mode frequency of said crystal.

References Cited in the file of this patent

UNITED STATES PATENTS

| | | |
|---|---|---|
| 1,606,791 | Horton | Nov. 16, 1926 |
| 2,070,647 | Bruaten | Feb. 16, 1937 |
| 2,494,321 | Usselman | Jan. 10, 1950 |
| 2,510,868 | Day | June 6, 1950 |
| 2,546,027 | Downey | Mar. 20, 1951 |

FOREIGN PATENTS

| | | |
|---|---|---|
| 224,321 | Switzerland | Feb. 16, 1943 |
| 904,290 | France | Oct. 31, 1945 |